US011073588B2

(12) United States Patent
Mühlich et al.

(10) Patent No.: US 11,073,588 B2
(45) Date of Patent: Jul. 27, 2021

(54) METHOD AND MAGNETIC RESONANCE IMAGING DEVICE FOR PERFORMING A QUALITY ANALYSIS OF A RADIO FREQUENCY COIL

(71) Applicant: Siemens Healthcare GmbH, Erlangen (DE)

(72) Inventors: Pascal Mühlich, Bubenreuth (DE); Andreas Potthast, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 34 days.

(21) Appl. No.: 16/407,532

(22) Filed: May 9, 2019

(65) Prior Publication Data

US 2019/0353742 A1 Nov. 21, 2019

(30) Foreign Application Priority Data

May 16, 2018 (EP) .................................... 18172651

(51) Int. Cl.
*G01R 33/58* (2006.01)
*G01R 33/34* (2006.01)
*G01R 33/36* (2006.01)

(52) U.S. Cl.
CPC ............ *G01R 33/58* (2013.01); *G01R 33/34* (2013.01); *G01R 33/3628* (2013.01)

(58) Field of Classification Search
CPC .... G01R 33/58; G01R 33/34; G01R 33/3628; G01R 33/36; G01R 33/385; A61B 5/055
See application file for complete search history.

(56) References Cited

U.S. PATENT DOCUMENTS 5,551,430 A * 9/1996 Blakeley .............. A61B 5/0555 324/318
6,025,717 A 2/2000 Hertz
8,190,237 B2 5/2012 Driemel
9,194,924 B2 11/2015 Kundner
9,360,541 B2 6/2016 Biber
2009/0302845 A1 12/2009 Biber
(Continued)

FOREIGN PATENT DOCUMENTS

CN 101644750 A 2/2010
CN 102066966 A 5/2011
(Continued)

OTHER PUBLICATIONS

European Search Report for European Patent Application No. 18172651.4-1022 dated Nov. 12, 2018.
(Continued)

*Primary Examiner* — Susan S Lee
(74) *Attorney, Agent, or Firm* — Lempia Summerfield Katz LLC

(57) ABSTRACT

A method is provided for performing a quality analysis of a radio frequency (RF) coil of a magnetic resonance imaging device. In an operational mode, the RF coil is configured to acquire MR signals from an object to be observed. In a test mode: a test signal is emitted by a RF transmitter; the test signal from the RF transmitter is received directly by the RF coil, wherein the RF coil provides an output signal; and a performance indicator is provided by analyzing the output signal of the RF coil for performing the quality analysis.

15 Claims, 1 Drawing Sheet

1 MR imaging device
2 Bore
3 RF coil
4 Amplifier
5 RF transmitter
8 Gradient coil
9 Gradient pulse signal
11 Performance indicator
13 RF receiver
20 Test signal
21 Output signal
22 Reference value
23 Output signal
30 Analysis of output signal
QA Quality assurance

(56) References Cited

U.S. PATENT DOCUMENTS

2010/0033180 A1 2/2010 Biber et al.
2011/0163757 A1 7/2011 Possanzini et al.
2016/0025798 A1 1/2016 Takagi
2017/0089991 A1 3/2017 Gruber
2019/0049534 A1* 2/2019 Guan ................. G01R 33/3628

FOREIGN PATENT DOCUMENTS

CN 103536288 A 1/2014
JP H06205753 A 7/1994

OTHER PUBLICATIONS

Chinese Office Action for Chinese Application No. 201910395778.X dated Mar. 3, 2021, with English translation.

* cited by examiner

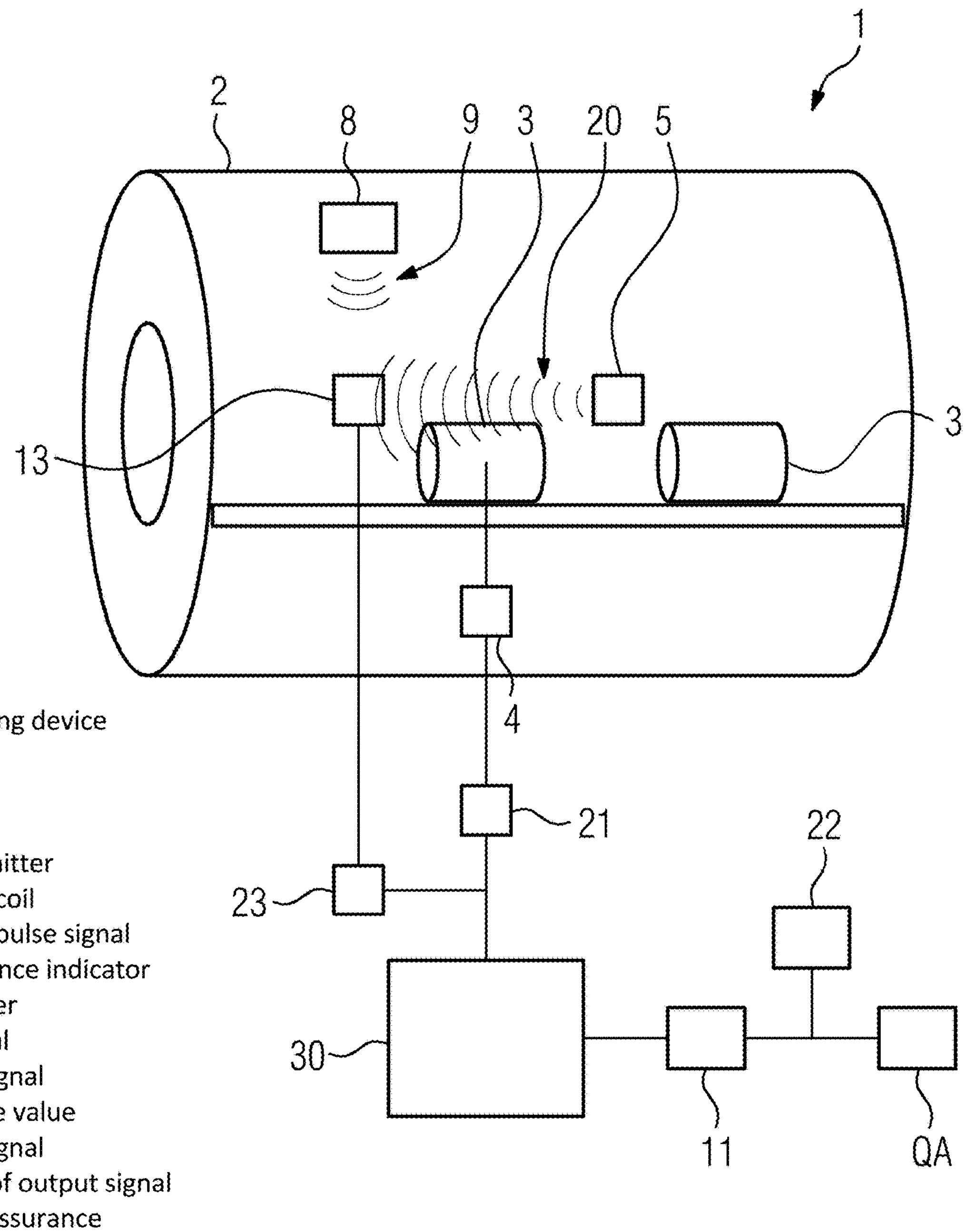
1
2
8
9
3
20
5
3
13
4
21
22
23
30
11
QA
1 MR imaging device
2 Bore
3 RF coil
4 Amplifier
5 RF transmitter
8 Gradient coil
9 Gradient pulse signal
11 Performance indicator
13 RF receiver
20 Test signal
21 Output signal
22 Reference value
23 Output signal
30 Analysis of output signal
QA Quality assurance

METHOD AND MAGNETIC RESONANCE IMAGING DEVICE FOR PERFORMING A QUALITY ANALYSIS OF A RADIO FREQUENCY COIL

The present patent document claims the benefit of European Patent Application No. EP 18172651.4, filed May 16, 2018, which is also hereby incorporated by reference.

TECHNICAL FIELD

The present disclosure relates to a method and a magnetic resonance imaging device for performing a quality analysis of a radio frequency (RF) coil.

BACKGROUND

Magnetic resonance imaging devices, (e.g., magnetic resonance tomography (MRI) scanners), are well known in the state of the art and are a powerful tool for getting insight into an inner structure of an object, (e.g., a patient). In MRI, the patient may be transferred into the bore of a magnet, and a local RF coil is placed at or near a region of interest about to be scanned. In an operational mode, an exciting RF signal is emitted by a RF transmitter, (e.g., a body coil), and a magnetic resonance signal from the object in response to the excitation RF signal is detected by the RF coil. The acquired data is collected and reconstructed for visualizing the inner structure of the patient. Several types of local coils are disclosed by U.S. Pat. No. 9,360,541 B2, U.S. Pat. No. 9,194,924 B2, U.S. Patent Application Publication No. 2017/0089991 A1, and U.S. Pat. No. 8,190,237 B2.

In order to provide the operational reliability and image quality in clinical magnetic resonance imaging (MRI) measurements, regular quality assurance (QA) measurements are performed. These QA measurements focus on local coil characteristics. With current magnetic resonance imaging devices, software tools are provided to check the quality of the RF coil. Such a local coil QA-procedure may require positioning of the local RF coil together with a suited MR phantom inside the bore by an operator. For large coils, (e.g., coils having a spatial extent lager than the field of view of the MRI scanner), multiple such phantom setups are provided successively.

At the start of the QA procedure, one or more MR measurements are performed. Subsequently, the obtained two-dimensional image data reconstructed from the acquired data is analyzed for image characteristics such as brightness and/or signal-to-noise ratio. As current local coils may feature multiple coil elements, both the combined data from all coil elements as well as the data from the individual elements are analyzed. The results of these evaluations are checked against reference values or benchmarks of suitable pre-defined specification parameters. This check provides pass/fail criteria of the local coil QA procedure.

SUMMARY AND DESCRIPTION

The scope of the present disclosure is defined solely by the appended claims and is not affected to any degree by the statements within this summary. The present embodiments may obviate one or more of the drawbacks or limitations in the related art.

It is an object of the present disclosure to improve, (e.g., to simplify), the procedure for performing a QA measurement of RF coils.

This object is achieved by the method for performing a quality analysis of a magnetic resonance imaging device and a magnetic resonance imaging device.

According to a first aspect, a method for performing a quality analysis of a RF coil of a magnetic resonance imaging device is provided, wherein in an operational mode the RF coil is designed to acquire MR-signals from an object to be observed. The following acts of the method are performed in a test mode: emitting a test signal by a RF transmitter; directly receiving the test signal from the RF transmitter by the RF coil, wherein the RF coil provides an output signal; and providing a performance indicator by analyzing the output signal of the RF coil for performing the quality analysis.

Contrary to the state of the art, a test signal provided by the RF transmitter is directly detected by the RF coil. Consequently, neither a phantom nor a MR-probe is needed and placed inside the bore. Thus, the QA procedure is simplified because the act of arranging the MR phantom inside the bore may be omitted. There is no need for orientating the MR phantom relative to the RF coil for guaranteeing reproducibility of the QA analysis. Further, the QA procedure may be performed automatically and the timing of the QA procedure does not depend on the availability of the MR-probe (when several magnetic resonance imaging devices share a common MR phantom, for example). Another advantage is that no two or three-dimensional image of the MR phantom, which includes a time-consuming imaging sequence and reconstructing of the MR signals, is needed. Instead, the output signal itself, (e.g., the raw data provided by the RF coil), is used for identifying modifications and/or defects of the RF coil. Thus, the effort for performing the QA-analysis is significantly reduced and performed faster compared to such methods that use the MR phantom and visualize the MR phantom in the QA procedure for identifying defects.

In the test mode, the RF transmitter, (e.g., a body coil of the magnetic resonance imaging device), may emit or inject a test signal that has at least an amplitude similar to the amplitude for response signals detected in the operational mode. These test signals are received directly by the RF-coil, (e.g., a local coil), such as a surface coil or a birdcage coil. It is even possible that the RF-coil is the body coil, in which case the RF transmitter is not the body coil, but an additional RF transmitter.

The term "directly" means that the receiver detects the emitted signal and does not detect a response signal emitted by an MR phantom or a patient in the test mode. The output signal is an electrical signal having a specific amplitude and/or time-dependency. The form of the output signal may depend on the test signal. Due to the processing by the RF coil and its electronics, the output signal also depends on the RF coil, e.g., a status of the RF-coil. Thus, it is possible to identify changes or modifications by using a known test signal. The test signal may be standardized such that a change in the output signal indicates a modification or a defect of the RF coil. In other words: The RF coil picks up the test signal, generates an output signal and the output signals for same test signals or at least similar test signals are compared.

The term "performance indicator" is generic for parameters suitable for evaluating the current quality of the magnetic resonance device. Examples for such performance indicators are a noise value, a signal-to-noise ratio value, a noise correlation amongst the various single coil elements, and a spike level. The determined performance indicator may be (e.g., automatically) compared to a reference value, and the operator is informed about the current status of the RF coil, (e.g., by the MRI device issuing a warning signal). A warning signal may also be provided when the performance indicator exceeds or falls below a threshold value. The performance indicator may be provided by a processor configured for analyzing the acquired data from the RF coil. For example, the processor is incorporated into a (e.g., personal) computer, such as a workstation or console of the medical imaging device. The processor may be part of the MRI device. The processor may be located at a server of a network or a cloud and the analysis may be performed online. Furthermore, the performance indicators may be saved in a memory device. Thus, it is advantageously possible to observe trends regarding the performance indicators. In particular, the quality analysis or QA procedure is a quality assurance measurement performed from time to time, e.g., at regular intervals. It is even conceivable that the method is executed in the absence of the operator, (for example, at nights), because there is no further action needed. Alternatively, the method is executed directly after and/or before operating the medical imaging device for diagnostic imaging or spectroscopy.

For example, it is possible to determine the signal-to-noise ratio by extracting the maximum amplitude of the output signal and the amplitude at a specific time before and/or after the test signal that causes the output signal of the RF coil. Subsequently, it is possible to determine the signal-to-noise ratio (SNR) by forming the relation of said two amplitudes. It is also possible that the time dependency of the output signal is recorded and that the recorded signal is processed by a Fourier transformation for getting spectral characteristics of the RF coil. The frequency of the test signal may be changed while the output signal is recorded. In this case, the performance indicator might be represented by a spectrum. The test signal may include several pulses or pulse sequences for increasing the accuracy of the measurement.

According to an embodiment, the output signal and/or the performance indicator is compared to a reference value. Thus, it is possible to identify a change or a difference to the reference signal. The difference between the performance indicator/output signal and the reference value may not exceed or go below a threshold for guaranteeing the proper functionality of the RF coil. A warning signal by the magnetic resonance device may be provided when the threshold is exceeded or underrun.

The reference value corresponds to a value based on a measurement during initialization of the medical resonance imaging device, and/or a benchmark value, for example, available at a corresponding data base. For example, the reference value corresponds to a performance indicator that was extracted from a measurement during the installation by using a MR probe or phantom. In other words, the QA procedure using the MR probe is performed for providing a reference value. Subsequently, the QA analysis of the RF coils is performed without the MR phantom or the MR probe. Alternatively, a standard or benchmark value for the specific RF coil may be used as a reference value.

An amplitude of the output signal and/or a time dependency of the amplitude of the output signal may be measured in order to provide a performance indicator. In particular, the time dependency of the output signal may be used for providing spectral characteristics of the RF coil by performing a Fourier transformation. It is also possible that only the maximum amplitude and/or an amplitude at a pre-defined time is extracted from the output signal.

In another embodiment, the RF coil is positioned at a predetermined location. Thus, it is possible to easily reproduce the condition that has been realized in previous measurements of the output signals in response of the test signal. The RF coil may be placed at a specific location in the bore of the magnetic resonance imaging device. The method may be performed outside the magnetic resonance imaging device, because the local RF coil may be separated from the magnetic resonance imaging device. In such a case, an additional external RF transmitter might also be used.

In another embodiment, the test signal includes several frequencies or a frequency sweep. Thus, the reaction of the output signal to the different frequencies may be analyzed and a frequency dependent reaction of the reaction coil that is suitable as a performance indicator may be identified.

According to another embodiment, the magnetic resonance imaging device includes a bore, wherein in the test mode, the bore is free from the object to be observed, the MR probe, and/or a phantom. Thus, it is advantageously possible to do the QA procedure without placing the object, the MR probe, and/or the phantom inside the bore. It is possible to use the available space for arranging several coils inside the bore.

In a useful embodiment, the RF coil is tuned and/or detuned during the reception of the test signal. Thus, another kind of response of the output signal to the test signal may be produced. This response may be used as another performance indicator. For example, it is provided to shift or vary the resonance frequency of the RF coil during the receipt of the test signal such that the resonance frequency matches a frequency, (e.g., a carrier frequency), of the test signal for a defined time interval and is detuned. Consequently, the output signal is reduced compared to the case of no detuning/tuning, because the resonance frequency of the RF coil at least temporarily does not match with the frequency of the test signal. Further, the output signals detected under the described condition allow extracting further spectral characteristics. It is also possible that the output signals are detected for several different tune/detune events that differ with respect to the time interval in that the resonance frequency matches the carrier frequency of the test signal and/or the beginning of the time interval with respect to the time of receiving the test signal by the RF coil. The tune/detune events may be generated during the reception of the output signal. The evaluation of the time course of the output signal allows determining the switching time between tune/detune and detune/tune of the RF coil.

In another embodiment, a further component of the medical resonance imaging device, such as an amplifier and/or gradients coils, is activated during the receipt of the test signal. Thus, it is advantageously possible to identify further performance indicators that are relevant for the performance of the magnetic resonance imaging device. For example, it is possible to generate different gradient pulses in a test sequence, wherein the gradient pulses differ in length and/or amplitude. These gradient pulses may be produced by gradient coils. Thus, it is possible to identify extremely high exceptional output signals that may cause a spike artefact in the medical image being visualized in the operational mode. Furthermore, it is possible to simulate realistic conditions that otherwise exist during the operational mode. For example, amplifiers are activated during or before the test signal is received by the RF coil. It is possible to simulate "disturbances" common in the operational mode in order to observe the reaction of the RF coil in response to the disturbances.

Several RF coils may be arranged inside the bore, wherein the test signal from the RF transmitter is received by each RF coil, wherein the RF coils each provide an output signal and provide performance indicators by analyzing the output signals of the RF coils for performing the quality analysis. The coils may be arranged next to each other and/or are connected with each other. Thus, it s advantageously possible to perform the quality analysis for several RF coils simultaneously. The RF coils may be arranged and connected with each other in a pre-defined manner for guaranteeing reproducible conditions.

In another embodiment, the test signal includes a RF pulse having a ramp shape or a rectangle shape. By modifying the shape of the pulses, it is possible to change the output signal as a response of the test signal. Consequently, it is possible to provide different performance indicators depending on the shape of the test signal.

According to another embodiment, the test signal is received by the RF coil and a further RF receiver for comparing the output signal of the RF coil and an output signal of the further RF receiver. It is possible to use the further RF receiver as an additional reference to control the test signal. It is also possible to use the further RF receiver to compensate for signal-to-signal fluctuation of the test signal. This increases the accuracy of determining the performance indicator. In addition, the further RF receiver may be used to guarantee that a standardized test signal is used for performing the quality analysis. The further RF receiver might be another coil or another sensor able to detect RF signals. The further receiver may be part of the MRI device.

According to another embodiment, an amplitude of the test signal is smaller than an amplitude of an operation signal used in the operational mode, wherein the signal amplitude of the test signal may be 100-10000 times smaller than the operation signal, e.g., 10000 times smaller than a maximum operation signal that is realizable by the specific magnetic resonance imaging device. Thus, it is avoided that the test signal causes damage to the RF coil. In particular, a saturation of the preamplifier is considered for choosing an amplitude of the test signal. For example, the preamplifier of the local coil has a max input level of about −30 dB and a transmission between the body coil and the local coil is about −40 dB for not saturating the preamplifier. A maximal amplitude of the signal, (e.g., the maximum operation signal), emitted by the body coil of a 3 Tesla system may be around 75 dB. For some additional safety the test signal might be reduced by 80 dB which corresponds to a factor 10000. The operation signal may be smaller than the maximal amplitude. Consequently, it is reasonable to assume that the amplitude of the test signal is 100 to 10000 smaller than the operation signal. It may be considered that the operation signal varies a lot and may have values between 10V (2 W, 33 dB) and 1.000V (20 kW, 73 dB).

In another embodiment, the RF transmitter is a body coil of the magnetic resonance imaging device or an additional RF transmitter.

The RF transmitter and the RF coil may be part or the magnetic resonance imaging device. For example, the RF transmitter is configured such that the RF transmitter emits operation signals in an operational mode and test signals in a test mode. Thus, it is advantageously possible to use the body coil for emitting both the operation signal as well as the test signal.

Alternatively, the RF transmitter may be an additional RF transmitter that is added to the magnetic resonance imaging device, (e.g., for the test mode), and the RF transmitter is configured only for emitting the test signal. The additional RF transmitter may be an external coil placed in the magnet bore of the magnetic resonance imaging device. Such an additional RF transmitter might be reasonable for upgrading such systems that cannot be easily switched to a test mode. Further, such an additional RF transmitter has the advantage that it may be used to perform a QA on the body coil.

Another aspect of the present disclosure is a magnetic resonance imaging device for performing a quality analysis of a RF coil. The magnetic resonance imaging device includes a RF transmitter. The magnetic resonance imaging device is configured for: emitting a test signal by the RF transmitter; directly receiving the test signal from the RF transmitter by the RF coil, wherein the RF coil provides an output signal; and providing a performance indicator by analyzing the output signal of the RF coil for performing the quality analysis.

All features described for the method may be transferred to the magnetic resonance imaging device and vice versa.

Another aspect of the present disclosure is a computer program product for carrying out the acts of the method when the computer program product is loaded into a memory of a programmable device.

A further aspect of the present disclosure is a computer-readable medium on which program elements are stored that may be read and executed by a computer unit in order to perform the acts of the method when the program elements are executed by the computer unit.

BRIEF DESCRIPTION OF THE DRAWING

FIG. 1 depicts a block diagram illustrating an example of a method for performing a quality analysis of a magnetic imaging device.

DETAILED DESCRIPTION

In FIG. 1, a block diagram is shown, wherein the block diagram illustrates a method for performing a quality assurance procedure, (e.g., a quality analysis QA), of a RF coil that is provided for magnet resonance imaging devices. Magnetic resonance imaging devices 1, such as magnetic resonance tomography devices, are powerful tools to get insight into an inner structure of a patient by, for instance, visualizing different tissues. The magnetic imaging device 1 includes a bore 2 formed by a magnet, a RF transmitter 5 such as a body coil, and a RF coil 3. In an operational mode, the patient is arranged inside the bore 2, for example, by using a table. The RF coil 3 forms the RF coil and is located at or near to a region of interest of the patient for visualizing the inner structure of the patient. For acquiring data, the RF transmitter 5 emits an operation signal that excites molecules inside the patient. Due to this excitation, a signal is emitted by the tissue to be observed, wherein the emitted signal, in turn, is received by the RF coil 3. Subsequently, the acquired data is used for visualizing the inner structure of the patient.

However, for guaranteeing a constant quality of the visualized images, functionality tests regarding the RF coil 3 are performed from time to time. Such a quality assurance procedure requires manually positioning the RF coil 3 and a corresponding MR phantom or probe in the bore 2 of the magnetic imaging device 1. Subsequently, several MR measurements are performed for identifying performance indicators 11 such as a brightness value and/or a signal-to-noise ratio. These determined performance indicators 11 may be compared to reference values 22, (for example, benchmark values), for checking whether the magnetic resonance imaging device 1 fails or passes the quality analysis QA.

For simplifying and accelerating the procedure of the quality analysis QA regarding the magnetic imaging device 1, a test signal 20 is emitted by the RF transmitter 5, (e.g., by the RF transmitter 5 of the magnetic resonance imaging device 1 such as a body coil), in a test or analysis mode of the magnetic imaging device 1. The test signal 20 of the RF transmitter 5 may be configured such that the test signal 20 has a similar amplitude to a response signal being emitted by the exited molecules of the RF phantom probe in order to avoid damage at the RF coil 3. The RF transmitter 5 may be the body coil of the magnetic resonance imaging devices 1 and may be operated in an operational mode and a test mode, wherein the signals emitted in the test mode have a smaller amplitude than the signals emitted in the operational mode. For example, the RF transmitter 5 may be switched between an operational mode and a test mode. It is also possible that there is an external additional RF transmitter 5 for producing the test signal 20, wherein the additional RF transmitter is not the body coil and may be inserted into the bore for preforming the emission of the test signal.

The test signal 20 emitted by the RF transmitter 5 is directly detected by the RF coil 3. In response to the test signal 20, the RF coil 3 provides an output signal 21. This output signal 21 may be an electrical signal having a certain amplitude and/or a certain time dependency. By analyzing 30 the output signal 21, it is possible to determine performance indicators 11. In other words, in the test mode the test signal 20 emitted by the RF transmitter 5 is directly transmitted to the RF coil 3 without exciting molecules inside the MR phantom or the MR probe. Consequently, it is advantageously possible to perform a quality analysis QA of the magnetic imaging device without placing a MR probe/phantom inside the bore 2. Thus, the procedure for checking the magnetic resonance imaging device 1 is simplified.

The amplitude of the output signal and/or its time dependency may be detected and compared to corresponding reference values 22. The reference values 22 might be a standard value or a benchmark for the specific coil or a value being measured during the installation and/or a maintenance of the medical resonance imaging device 1, e.g., during its installation, in particular, by using a phantom and/or a MR probe. The signal-to-noise ratio may be determined by the relation between the maximum amplitude of the output signal 21 and an amplitude of the output signal 21 when the output signals 21 is faded away. Another key performance indicator might originate from the time dependency of the output signal 21. For example, performing a Fourier transformation of the output signal 21 provides a frequency dependent specification as a performance indicator 11, such as a specific spectrum, that may be used for quality analysis QA.

Furthermore, it is possible to modify the time-dependency of the test signal 20 to manipulate the output signal 20 in order to extract further information about the tested RF coil 3 from the corresponding output signal 21 depending on the specific test signal 20 form. For example, the test signal 20 includes several different frequencies and/or a frequency sweep and/or has a rectangular shape or a ramp shape. In the case of a test signal 20 having several frequencies, it is possible to extract information about the frequency characteristics of the RF coil 3.

Receiving the test signal by the RF coil may be accompanied by modifying a status of the medical resonance imaging device for identifying characteristic specifications. For example, it is possible to tune and/or detune the RF coil 3, e.g., to shift a receiving frequency in or out of resonance with the frequency of the test signal. The detuning/tuning may start at different times with respect to the receiving of the test signal 20.

Signals of gradient pulse signals 9 emitted by one or several gradient coils 8 may be emitted during the reception of the test signal 20 by the RF coil 3. Gradient pulse signals 9 of different length and amplitude may be used. Consequently, it might register an output signal 21 that has an abnormal high amplitude for a gradient pulse signal 9 having a specific length or amplitude. Such an event might result in a spike in a subsequent visualization of the acquired data.

The test signal 20 may correspond to a noise signal caused by a component of the medical resonance imaging device 1 in the operational mode. An example for such a component might be an amplifier 4, such as a RF power amplifier 4 that switched to an active status directly before receiving the response signal by the RF coil 3 in the operational mode. The noise generated by the amplifier may be a white noise. Considering the spectral characteristics of the RF transmitter 5, it might be possible to extract the spectral characteristics of the RF coil 3 being result of the test signal 20 representing the noise of the amplifier 4.

Furthermore, it is possible to detect the test signal 20 in the test mode by a further RF receiver 13, wherein the further RF receiver provides further output signals 23. Thus, it is possible to take signal-to-signal fluctuation into account when output signals 21 are acquired from a sequence of test signals 20. It is possible to identify test signals that are not appropriate for performing the analysis, because they differ from a standardized test signal too much.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for performing a quality analysis (QA) of a radio frequency (RF) coil of a magnetic resonance imaging device configured to acquire magnetic resonance (MR) signals by the RF coil from an object in an operational mode of the magnetic resonance imaging device, the method comprising performing the following in a test mode by the magnetic resonance imaging device:

emitting a test signal by a RF transmitter;

receiving directly the test signal from the RF transmitter by the RF coil, wherein the RF coil provides an output signal;

activating a component of the magnetic resonance imaging device during the receiving of the test signal to simulate a realistic condition for the operational mode, wherein the component is an amplifier, a gradient coil, or a combination thereof; and analyzing, by a processor of the magnetic resonance imaging device or a processor in communication with the magnetic resonance imaging device, the output signal of the RF coil, therein providing a performance indicator for the quality analysis.

2. The method of claim 1, wherein the output signal, the performance indicator, or both the output signal and the performance indicator are compared to a reference value.

3. The method of claim 2, wherein the reference value corresponds to a value based on a measurement during an initialization of the magnetic resonance imaging device, a benchmark value, or a combination thereof.

4. The method of claim 1, wherein, in the providing of the performance indicator, an amplitude of the output signal, a time dependency of the amplitude of the output signal, or both the amplitude of the output signal and the time dependency of the amplitude of the output signal are detected.

5. The method of claim 1, wherein the test signal comprises several frequencies or a frequency sweep.

6. The method of claim 1, wherein the magnetic resonance imaging device comprises a bore, and wherein, in the test mode, the bore is free from the object to be observed, a MR probe, a phantom, or a combination thereof.

7. The method of claim 6, wherein a plurality of RF coils is arranged inside the bore, wherein the test signal from the RF transmitter is received by each RF coil of the plurality of RF coils, wherein each RF coil of the plurality of RF coils provides an output signal, and wherein performance indicators are provided by analyzing the output signals of the plurality of RF coils for the quality analysis.

8. The method of claim 1, wherein, during the receiving of the test signal, the RF coil is tuned or detuned.

9. The method of claim 1, wherein the test signal includes a RF pulse having a ramp shape or a rectangular shape.

10. The method of claim 1, wherein the test signal is received by the RF coil and a further RF receiver for comparing the output signal of the RF coil and a further output signal of the further RF receiver.

11. The method of claim 1, wherein the RF transmitter is a body coil of the magnetic resonance imaging device or an additional RF transmitter.

12. The method of claim 1, further comprising:

identifying, by the processor of the magnetic resonance imaging device or a processor in communication with the magnetic resonance imaging device, whether any defects of the RF coil are present or whether any modifications to the RF coil are needed based on the performance indicator.

13. A magnetic resonance imaging device for performing a quality analysis of a radio frequency (RF) coil in a test mode of the magnetic resonance imaging device, the magnetic resonance imaging device comprising:

a RF transmitter configured to emit a test signal;

a RF coil configured to directly receive the test signal from the RF transmitter, wherein the RF coil provides an output signal; and a processor configured to:

activate a component of the magnetic resonance imaging device during the receiving of the test signal to simulate a realistic condition for an operational mode of the magnetic resonance imaging device, wherein the component is an amplifier, a gradient coil, or a combination thereof, and analyze the output signal of the RF coil to provide a performance indicator for the quality analysis of the RF coil in the test mode of the magnetic resonance imaging device.

14. A non-transitory computer program product that is directly loadable into a memory of a magnetic resonance imaging device, wherein the computer program product, when executed by the magnetic resonance imaging device, is configured to cause the magnetic resonance imaging device to:

emit a test signal by a radio frequency (RF) transmitter;

directly receive the test signal from the RF transmitter by a RF coil, wherein the RF coil provides an output signal;

activate a component of the magnetic resonance imaging device during receipt of the test signal to simulate a realistic condition for a operational mode of the magnetic resonance imaging device, wherein the component is an amplifier, a gradient coil, or a combination thereof; and analyze the output signal of the RF coil to provide a performance indicator for a quality analysis of the magnetic resonance imaging device.

15. The non-transitory computer program product of claim 14, wherein the computer program product is further configured to cause the magnetic resonance imaging device to:

identify whether any defects of the RF coil are present or whether any modifications to the RF coil are needed based on the performance indicator.

* * * * *